United States Patent
Chen

(10) Patent No.: US 8,995,149 B2
(45) Date of Patent: Mar. 31, 2015

(54) KEYBOARD DEVICE WITH A SUPPORT FOR SUPPORTING A KEYBOARD

(71) Applicant: Darfon Electronics Corp., Taoyuan (TW)

(72) Inventor: Chih-Hao Chen, Taoyuan (TW)

(73) Assignees: Darfon Electronics (Suzhou) Co., Ltd., Suzhou, Jiangsu Province (JP); Darfon Electronics Corp., Gueishan, Taoyuan (TW)

( * ) Notice: Subject to any disclaimer, the term of this patent is extended or adjusted under 35 U.S.C. 154(b) by 142 days.

(21) Appl. No.: 13/792,188

(22) Filed: Mar. 10, 2013

(65) Prior Publication Data

US 2013/0279141 A1 Oct. 24, 2013

(30) Foreign Application Priority Data

Apr. 19, 2012 (TW) .............................. 101207228 U

(51) Int. Cl.
*H05K 7/02* (2006.01)
*H05K 7/04* (2006.01)
*H05K 7/14* (2006.01)
*G06F 1/16* (2006.01)

(52) U.S. Cl.
CPC ................ *H05K 7/14* (2013.01); *G06F 1/1632* (2013.01)
USPC ............................ 361/809; 361/810; 361/755

(58) Field of Classification Search
USPC ..................... 361/807, 809, 810, 755, 679.01
See application file for complete search history.

(56) References Cited

U.S. PATENT DOCUMENTS

| | | | | |
|---|---|---|---|---|
| 5,996,778 A | * | 12/1999 | Shih ............................. | 206/45.2 |
| 6,447,196 B1 | * | 9/2002 | Arkwright ........................ | 402/8 |
| 7,545,634 B2 | * | 6/2009 | Simonian et al. ........ | 361/679.55 |
| 8,358,513 B2 | * | 1/2013 | Kim ............................... | 361/807 |
| 8,424,829 B2 | * | 4/2013 | Lu et al. ......................... | 248/371 |
| 8,544,639 B2 | * | 10/2013 | Yang et al. .................... | 206/45.2 |
| 8,757,375 B2 | * | 6/2014 | Huang .......................... | 206/320 |
| 2013/0020216 A1 | * | 1/2013 | Chiou .......................... | 206/320 |

* cited by examiner

*Primary Examiner* — Hung S Bui
(74) *Attorney, Agent, or Firm* — Winston Hsu; Scott Margo

(57) ABSTRACT

The invention discloses a keyboard device including a keyboard and a support for protecting the keyboard or accommodating a portable information processing device. The support of the invention is capable of rotate in a direction away from the keyboard to be at a supporting state. The support of the invention is also capable of rotate in a direction toward the keyboard to cover whole of the top of the keyboard.

24 Claims, 9 Drawing Sheets

KEYBOARD DEVICE WITH A SUPPORT FOR SUPPORTING A KEYBOARD

BACKGROUND OF THE INVENTION

1. Field of the Invention

The present invention relates to a keyboard device, and more specifically, to a keyboard device with a support capable of covering a top of a keyboard and capable of supporting a portable information processing device at a supporting state by rotation alternatively.

2. Description of the Prior Art

Since modern technology trends to small size and light weight, a portable computer has been more and more popular in computer industry. Accordingly, a keyboard as an input interface equipped for the portable computer also trends to a thin size. A keyboard cover is designed for preventing careless touch of the keyboard when the keyboard is not used. Furthermore, a supporting frame is designed for supporting the portable computer when the portable computer is used. However, there is no peripheral device cooperating with the keyboard as combination of the keyboard cover and the supporting frame in the market.

SUMMARY OF THE INVENTION

The present invention provides a keyboard device with a support capable of covering a top of a keyboard and capable of supporting a portable information processing device at a supporting state by rotation alternatively.

According to an embodiment of the present invention, the keyboard device includes a keyboard and a support. The support is for protecting the keyboard or accommodating a portable information processing device. The support includes a main body, a connecting portion, a first supporting portion and a second supporting portion. One end of the connecting portion is pivoted to a bottom side of the main body, and the other end of the connecting portion is connected to the keyboard. The first supporting portion is pivoted to a first lateral side of the main body. The second supporting portion is pivoted to a second lateral side of the main body. The main body is for rotating in a first direction away from the keyboard, the first supporting portion and the second supporting portion are for rotating in the first direction away from the keyboard so that a lateral side of the first supporting portion and a lateral side of the second supporting portion contact against each other, and a bottom side of the first supporting portion and a bottom side of the second supporting portion stand on a plane, so as to support the support on the plane at a supporting state as the keyboard is placed on the plane.

According to another embodiment of the present invention, the support further includes a first fastening portion and a second fastening portion. The first fastening portion is pivoted to the lateral side of the first supporting portion, and the second fastening portion is pivoted to the lateral side of the second supporting portion. The first fastening portion and the second fastening portion are for releasably being fastened together so as to fasten the lateral side of the first supporting portion and the lateral side of the second supporting portion as the support is at the supporting state.

According to another embodiment of the present invention, the first fastening portion includes a first magnetic component, the second fastening portion includes a first magnetic induction component, and the first magnetic component and the first magnetic induction component are for releasably attracting each other so as to releasably fasten the first fastening portion and the second fastening portion. The support further includes a second magnetic component and a second magnetic induction component. The second magnetic component is disposed on the keyboard and corresponding to the first magnetic induction component, and the second magnetic induction component is disposed on the keyboard and corresponding to the first magnetic component. The first magnetic component and the second magnetic induction component are for releasably attracting each other and the first magnetic induction component and the second magnetic component are for releasably attracting each other, as the main body, the first supporting portion, the second supporting portion, the first fastening portion and the second fastening portion are for rotating in a second direction opposite to the first direction and close to the keyboard, so as to cover a top of the keyboard.

According to another embodiment of the present invention, the first fastening portion comprises a third magnetic component, the second fastening portion comprises a fourth magnetic component, and the third magnetic component and the fourth magnetic component are for releasably attracting each other due to being opposite magnetic poles so as to releasably fasten the first fastening portion and the second fastening portion. The support further includes a fifth magnetic component and a sixth magnetic component. The fifth magnetic component is disposed on the keyboard and corresponding to the third magnetic component. The fifth magnetic component and the third magnetic component are for releasably attracting each other due to being opposite magnetic poles. The sixth magnetic component is disposed on the keyboard and corresponding to the fourth magnetic component, and the sixth magnetic component and the fourth magnetic component are for releasably attracting each other due to being opposite magnetic poles. The fifth magnetic component and the third magnetic component are for releasably attracting each other and the sixth magnetic component and the fourth magnetic component are for releasably attracting each other, as the main body, the first supporting portion, the second supporting portion, the first fastening portion and the second fastening portion are for rotating in a second direction opposite to the first direction and close to the keyboard, so as to cover a top of the keyboard.

According to another embodiment of the present invention, the first fastening portion includes a first velcro tape, the second fastening portion includes a second velcro tape, and the first velcro tape and the second velcro tape are for releasably attaching each other so as to releasably fasten the first fastening portion and the second fastening portion. The support further includes a third velcro tape disposed on the keyboard and corresponding to the first velcro tape, and a fourth velcro tape disposed on the keyboard and corresponding to the second velcro tape. The third velcro tape and the first velcro tape are for releasably attaching each other and the fourth velcro tape and the second velcro tape are for releasably attaching each other, as the main body, the first supporting portion, the second supporting portion, the first fastening portion and the second fastening portion are for rotating in a second direction opposite to the first direction and close to the keyboard, so as to cover a top of the keyboard.

According to another embodiment of the present invention, the first fastening portion and the second fastening portion respectively include a reusable adhesive layer, and the first fastening portion and the second fastening portion are releasably fastened by affixing the reusable adhesive layers.

According to another embodiment of the present invention, the support further includes a first attachment portion pivoted to the bottom side of the first supporting portion, and a second attachment portion pivoted to the bottom side of the second supporting portion. The first attachment portion and the second attachment portion are placed flatly on the plane as the support is at the supporting state, and the main body, the first supporting portion, the second supporting portion, the first fastening portion, the second fastening portion, the first attachment portion and the second attachment portion are for rotating in a second direction opposite to the first direction and close to the keyboard, so as to cover a whole top of the keyboard.

According to another embodiment of the present invention, the main body, the connecting portion, the first supporting portion, the second supporting portion, the first fastening portion, the second fastening portion, the first attachment portion and the second attachment portion are sheet structures, respectively.

According to another embodiment of the present invention, the main body substantially has a shape of a trapezoid, a rectangle, or a triangle.

According to another embodiment of the present invention, the other end of the connecting portion is connected to a bottom of the keyboard.

According to another embodiment of the present invention, a slot is formed between the main body, the connecting portion and the keyboard for accommodating the portable information processing device as the support is at the supporting state.

The present invention provides the keyboard device with the support not only capable of covering the top of the keyboard for protecting the keyboard or preventing careless touch of the keyboard when the keyboard is not used, but also capable of supporting a portable information processing device at the supporting state by rotation when the portable information processing device is used, alternatively.

These and other objectives of the present invention will no doubt become obvious to those of ordinary skill in the art after reading the following detailed description of the embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention maybe practiced. In this regard, directional terminology, such as "top," "bottom," "front," "back," etc., is used with reference to the orientation of the Figure (s) being described. The components of the present invention can be positioned in a number of different orientations. As such, the directional terminology is used for purposes of illustration and is in no way limiting. Accordingly, the drawings and descriptions will be regarded as illustrative in nature and not as restrictive.

Figure 1:
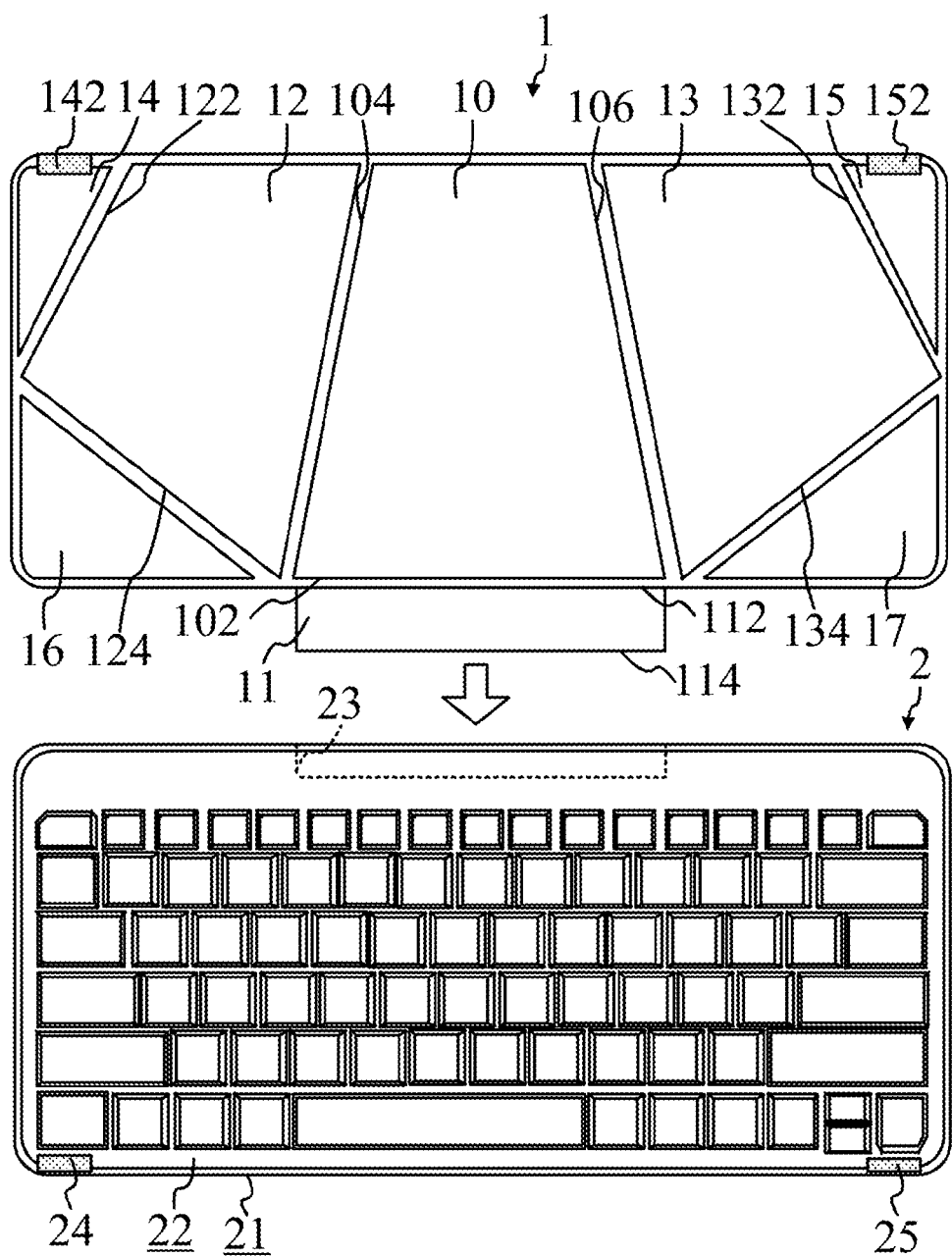
FIG. 1 to FIG. 6 are diagrams of a keyboard device with a support cooperating with a keyboard at different states according to a preferred embodiment of the present invention.
Figure 2:
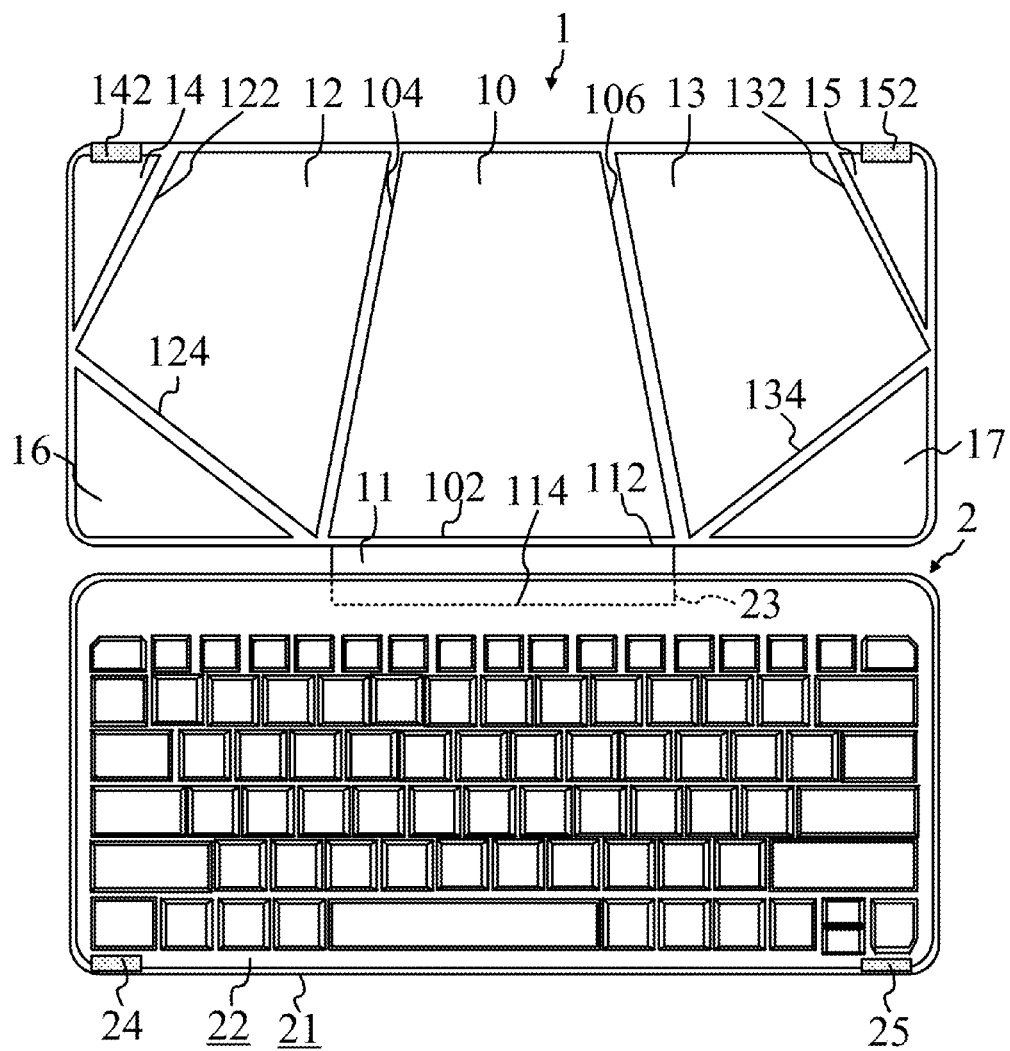

Please refer to FIG. 1 to FIG. 6. FIG. 1 to FIG. 6 are diagrams of a keyboard device with a support 1 cooperating with a keyboard 2 at different states according to a preferred embodiment of the present invention. As shown in FIG. 1, the support 1 includes a main body 10, a connecting portion 11, a first supporting portion 12 and a second supporting portion 13. One end 112 of the connecting portion 11 is pivoted to a bottom side 102 of the main body 10, and the other end 114 of the connecting portion 11 is connected to the keyboard 2. The other end 114 of the connecting portion 11 can be connected to a bottom 21 of the keyboard 2. For example, as shown in FIG. 2, the other end 114 of the connecting portion 11 can be inserted to a socket 23 on the bottom 21 of the keyboard 2.

Figure 4:
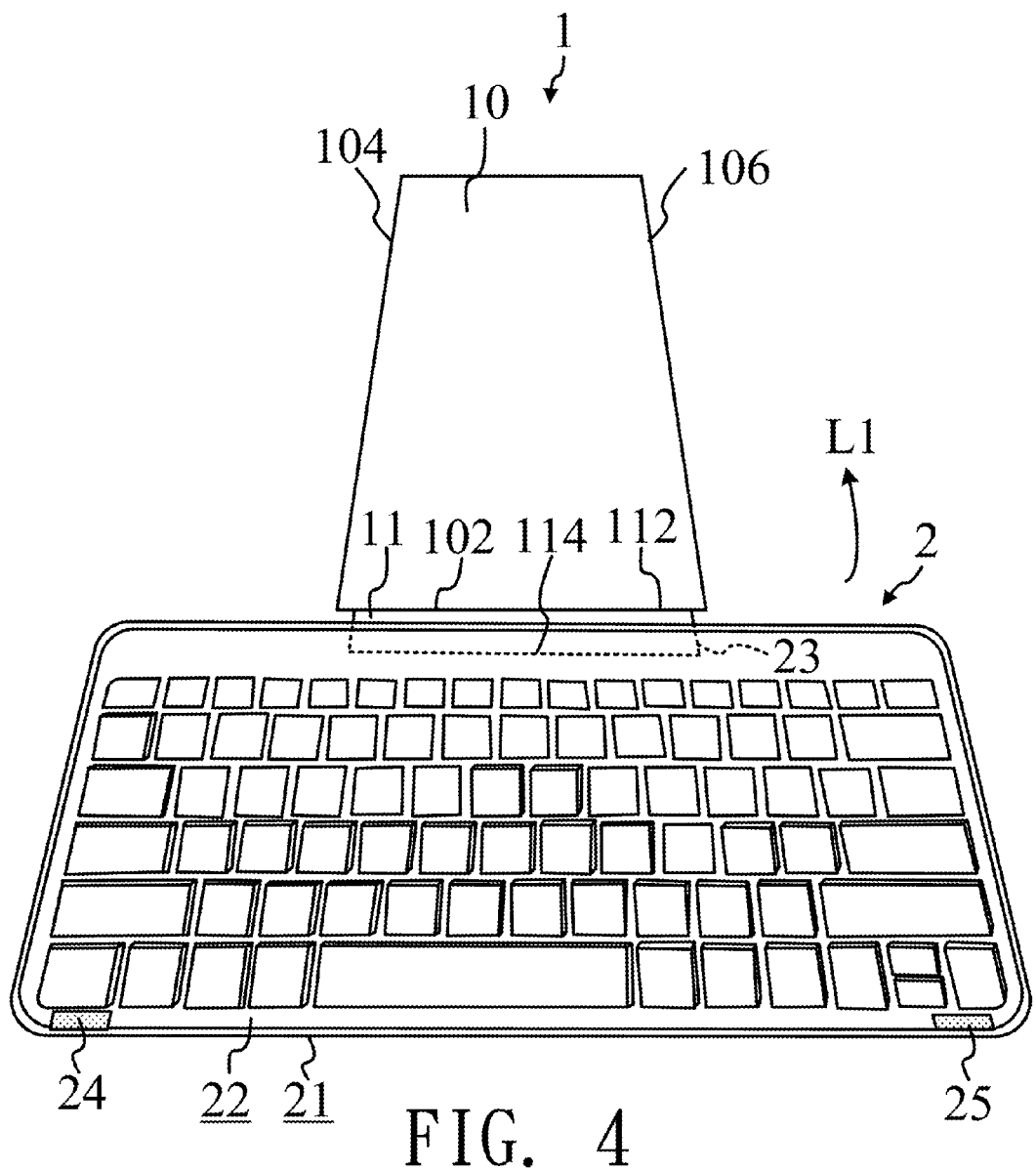
Figure 5:
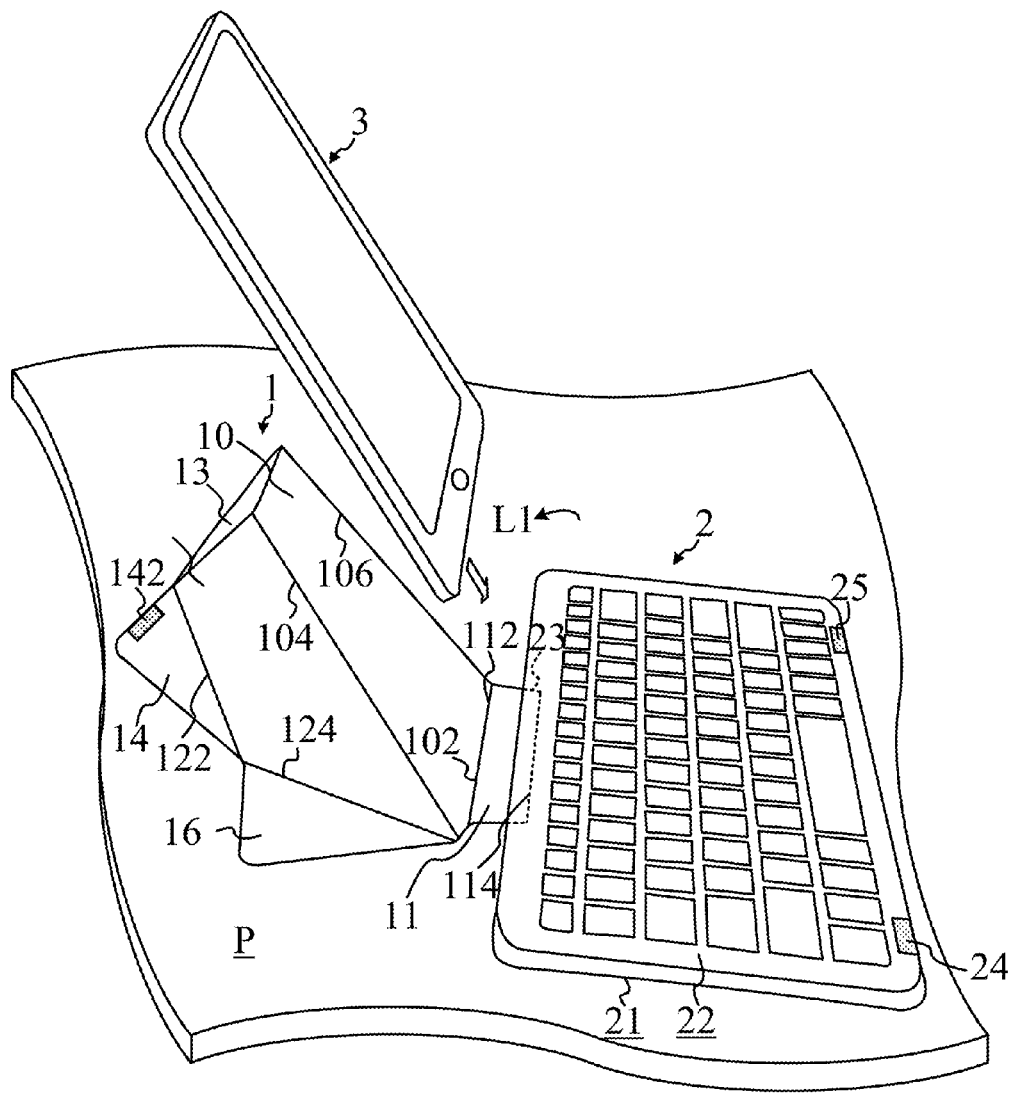
Figure 6:
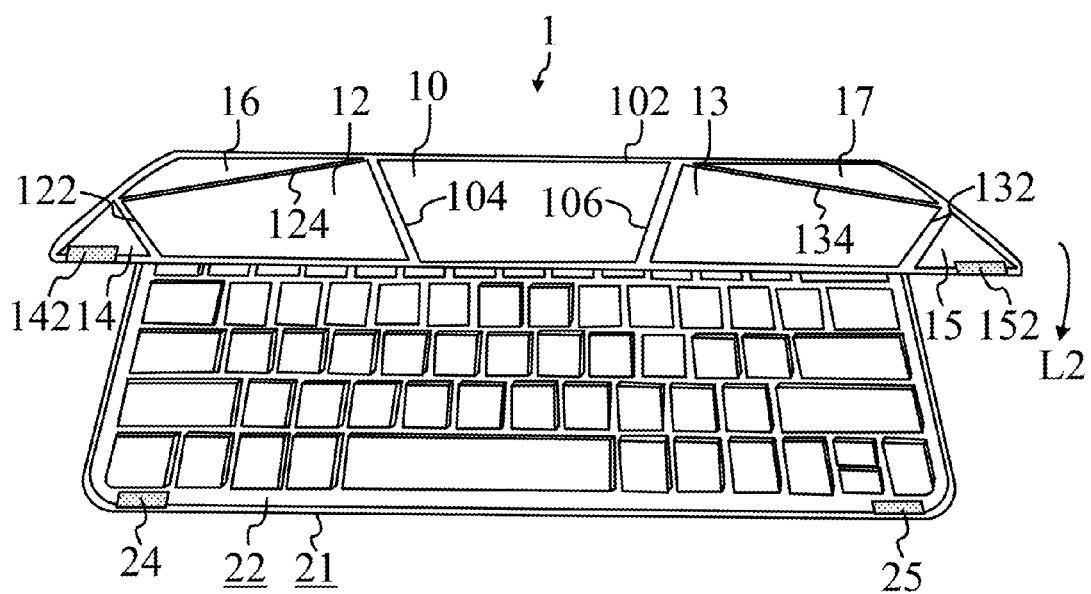

As shown in FIG. 4 to FIG. 6, the first supporting portion 12 is pivoted to a first lateral side 104 of the main body 10. The second supporting portion 13 is pivoted to a second lateral side 106 of the main body 10. The main body 10 can rotate in a first direction L1 away from the keyboard 2, the first supporting portion 12 and the second supporting portion 13 also can rotate in the first direction L1 away from the keyboard 2 so that a lateral side 122 of the first supporting portion 12 and a lateral side 132 of the second supporting portion 13 contact against each other, and a bottom side 124 of the first supporting portion 12 and a bottom side 134 of the second supporting portion 13 stand on a plane P, so as to support the support 1 on the plane P at a supporting state as the keyboard 2 is placed on the plane P.

The support 1 further includes a first fastening portion 14 and a second fastening portion 15. The first fastening portion 14 is pivoted to the lateral side 122 of the first supporting portion 12, and the second fastening portion 15 is pivoted to the lateral side 132 of the second supporting portion 13. The first fastening portion 14 and the second fastening portion 15 are for releasably being fastened together so as to fasten the lateral side 122 of the first supporting portion 12 and the lateral side 132 of the second supporting portion 13 as the support 1 is at the supporting state.

As shown in FIG. 5, the support 1 further includes a first attachment portion 16 and a second attachment portion 17. The first attachment portion 16 is pivoted to the bottom side 124 of the first supporting portion 12. The second attachment portion 17 is pivoted to the bottom side 134 of the second supporting portion 13. The first attachment portion 16 and the second attachment portion 17 are placed flatly on the plane P as the support 1 is at the supporting state. As shown in FIG. 6, the main body 10, the first supporting portion 12, the second supporting portion 13, the first fastening portion 14, the second fastening portion 15, the first attachment portion 16 and the second attachment portion 17 can rotate in a second direction L2 opposite to the first direction L1 and close to the keyboard 2, so as to cover a whole top 22 of the keyboard 2.

The main body 10, the connecting portion 11, the first supporting portion 12, the second supporting portion 13, the first fastening portion 14, the second fastening portion 15, the first attachment portion 16 and the second attachment portion 17 can be sheet structures, respectively. The main body 10 can substantially have a shape of a trapezoid, a rectangle, a triangle, and so on. In practical application, the first supporting portion 12, the second supporting portion 13, the first fastening portion 14, the second fastening portion 15, the first attachment portion 16 and the second attachment portion 17 can be made of stiff or half-stiff material, such as high polymer material, leather, metal material, and so on. The adjacent portions can be connected foldably or pivotably.

As shown in FIG. 5, a slot is formed between the main body 10, the connecting portion 11 and the keyboard 2 for accommodating a portable information processing device 3, such as a smart phone, a tablet computer, and so on, as the support 1 is at the supporting state. The support 1 can support the portable information processing device 3.

Figure 3:
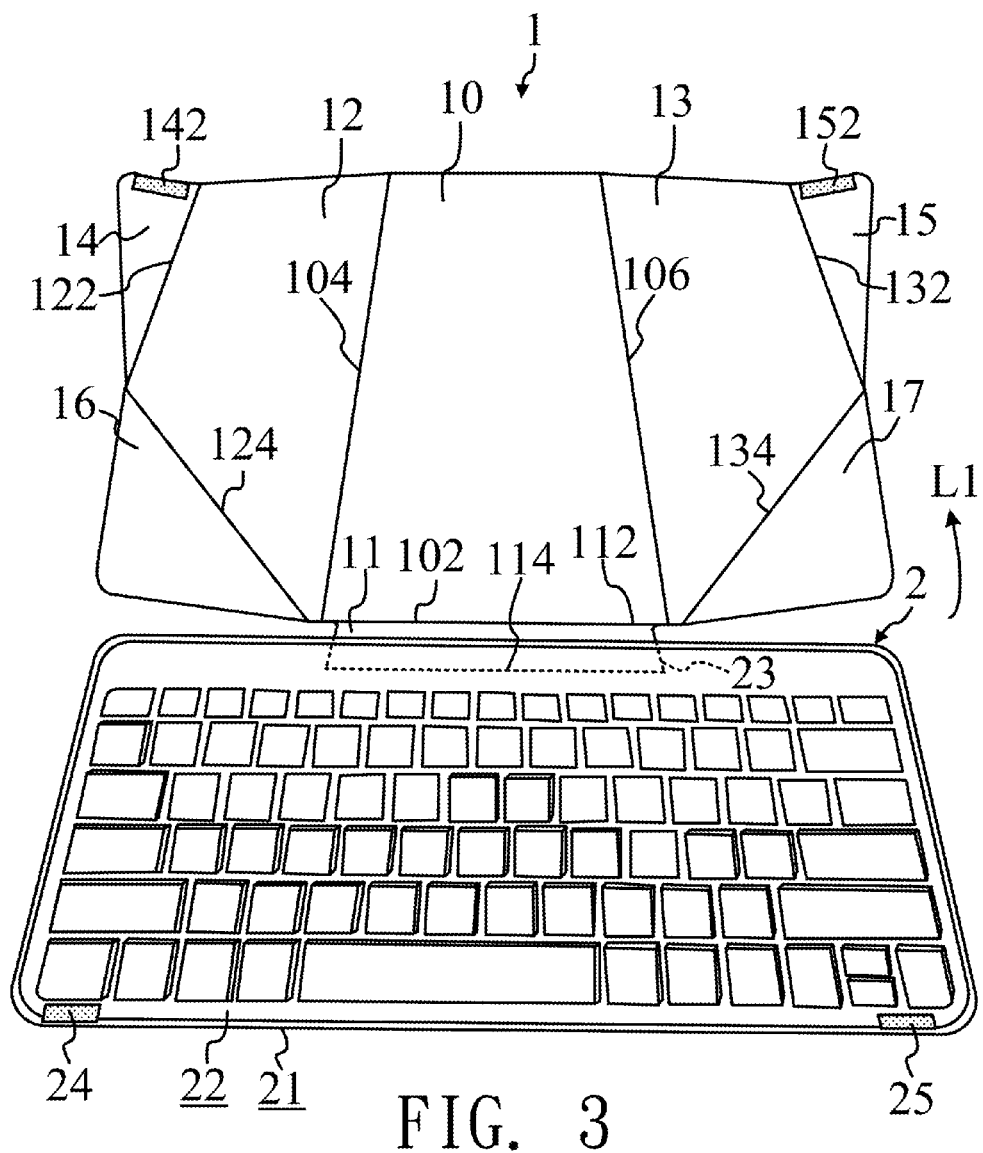

As shown in FIG. 3, the first fastening portion 14 includes a first magnetic component 142, and the second fastening portion 15 includes a first magnetic induction component 152. The first magnetic component 142 and the first magnetic induction component 152 are for releasably attracting each other so as to releasably fasten the first fastening portion 14 and the second fastening portion 15. Further, as shown in FIG. 6, the support 1 further includes a second magnetic induction component 24 disposed on the keyboard 2 and corresponding to the first magnetic component 142, and a second magnetic component 25 disposed on the keyboard 2 and corresponding to the first magnetic induction component 152. The first magnetic component 142 and the second magnetic induction component 24 can releasably attract each other by magnetic induction and the first magnetic induction component 152 and the second magnetic component 25 can releasably attract each other by magnetic induction, as the main body 10, the first supporting portion 12, the second supporting portion 13, the first fastening portion 14 and the second fastening portion 15 rotate in a second direction L2 opposite to the first direction L1 and close to the keyboard 2, so as to cover the top 22 of the keyboard 2.

Figure 7:
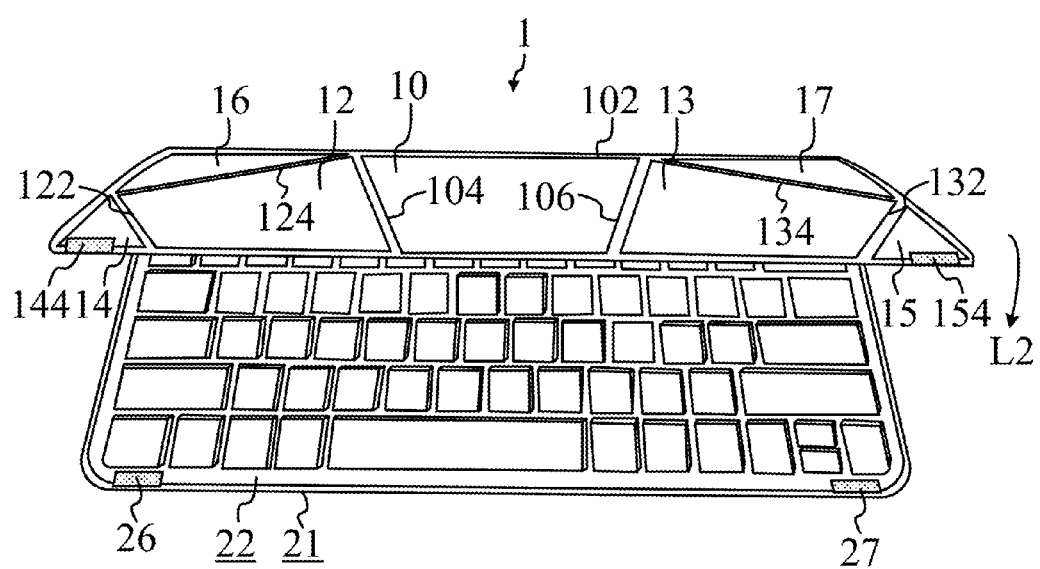
FIG. 7 to FIG. 9 are diagrams of the support according to other embodiments of the present invention.

Please refer to FIG. 7. FIG. 7 is a diagram of the support 1 according to another embodiment of the present invention. The first fastening portion 14 includes a third magnetic component 144, and the second fastening portion 15 includes a fourth magnetic component 154. The third magnetic component 144 and the fourth magnetic component 154 can releasably attract each other due to being opposite magnetic poles, so as to releasably fasten the first fastening portion 14 and the second fastening portion 15. Further, the support 1 further includes a fifth magnetic component 26 disposed on the keyboard 2 and corresponding to the third magnetic component 144, and a sixth magnetic component 27 disposed on the keyboard 2 and corresponding to the fourth magnetic component 154. The fifth magnetic component 26 and the third magnetic component 144 can releasably attract each other due to being opposite magnetic poles. The sixth magnetic component 27 and the fourth magnetic component 154 can releasably attract each other due to being opposite magnetic poles. The fifth magnetic component 26 and the third magnetic component 144 can releasably attract each other and the sixth magnetic component 27 and the fourth magnetic component 154 can releasably attract each other, as the main body 10, the first supporting portion 12, the second supporting portion 13, the first fastening portion 14 and the second fastening portion 15 rotate in the second direction L2 opposite to the first direction L1 and close to the keyboard 2, so as to cover the top 22 of the keyboard 2. In FIG. 7, the same components as those shown in FIG. 6 are denoted by the same reference numerals and a description thereof will not be repeated.

Figure 8:
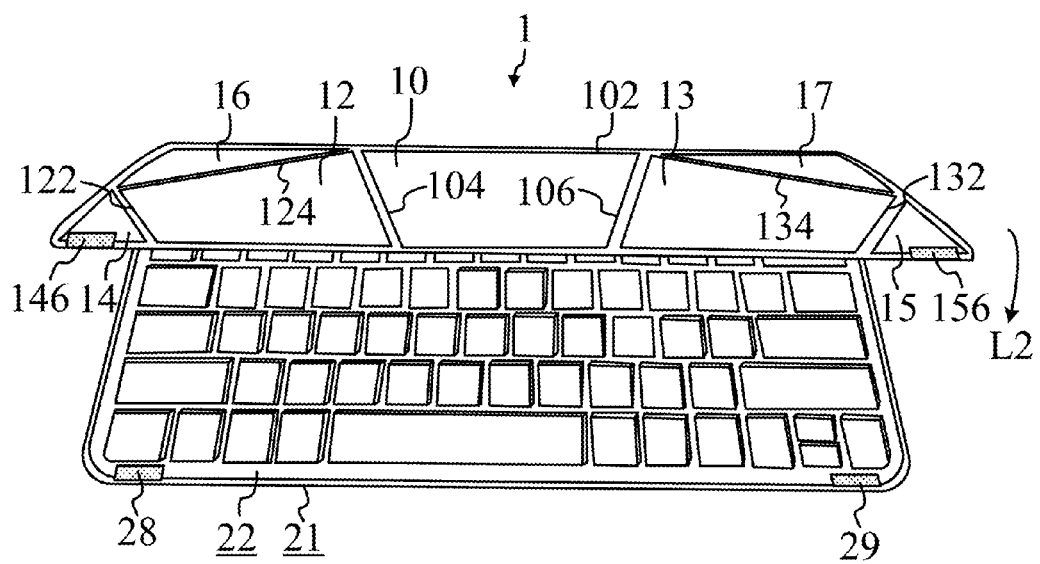

Please refer to FIG. 8. FIG. 8 is a diagram of the support 1 according to another embodiment of the present invention. The first fastening portion 14 includes a first velcro tape 146, and the second fastening portion 15 includes a second velcro tape 156. The first velcro tape 146 and the second velcro tape 156 can releasably attach each other so as to releasably fasten the first fastening portion 14 and the second fastening portion 15. The supporting 1 further includes a third velcro tape 28 disposed on the keyboard 2 and corresponding to the first velcro tape 146, and a fourth velcro tape 29 disposed on the keyboard 2 and corresponding to the second velcro tape 156. The third velcro tape 28 and the first velcro tape 146 can releasably attach each other and the fourth velcro tape 29 and the second velcro tape 156 can releasably attach each other, as the main body 10, the first supporting portion 12, the second supporting portion 13, the first fastening portion 14 and the second fastening portion 15 rotate in the second direction L2 opposite to the first direction L1 and close to the keyboard 2, so as to cover the top 22 of the keyboard 2. In FIG. 8, the same components as those shown in FIG. 6 are denoted by the same reference numerals and a description thereof will not be repeated.

Figure 9:
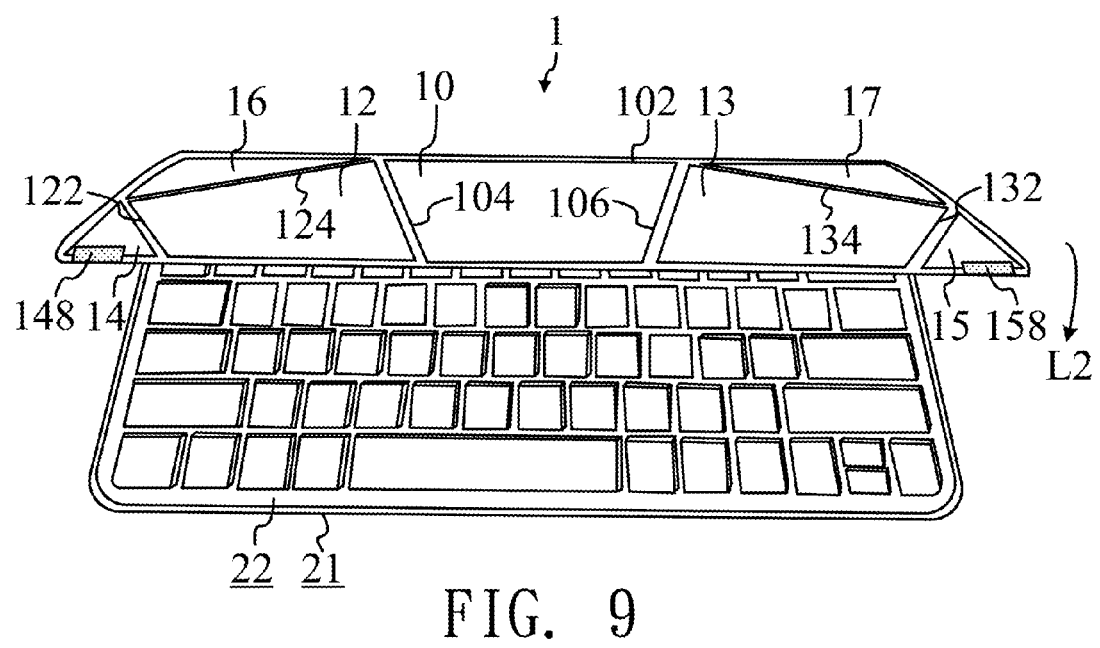

Please refer to FIG. 9. FIG. 9 is a diagram of the support 1 according to another embodiment of the present invention. The first fastening portion 14 includes a reusable adhesive layers 148, and the second fastening portion 15 includes a reusable adhesive layers 158. The first fastening portion 14 and the second fastening portion 15 can be releasably fastened by affixing the reusable adhesive layer 148 and the reusable adhesive layers 158. The reusable adhesive layer 148 and the reusable adhesive layer 158 can be affixed to the top 22 of the keyboard 2 repeatedly, as the main body 10, the first supporting portion 12, the second supporting portion 13, the first fastening portion 14 and the second fastening portion 15 rotate in the second direction L2 opposite to the first direction L1 and close to the keyboard 2, so as to cover the top 22 of the keyboard 2. In FIG. 9, the same components as those shown in FIG. 6 are denoted by the same reference numerals and a description thereof will not be repeated.

In contrast with the prior art, the present invention provides the keyboard device with the support not only capable of covering the top of the keyboard for protecting the keyboard or preventing careless touch of the keyboard when the keyboard is not used, but also capable of supporting the portable information processing device at the supporting state by rotation when the portable information processing device is used, alternatively.

Those skilled in the art will readily observe that numerous modifications and alterations of the device and method may be made while retaining the teachings of the invention.

What is claimed is:

1. A keyboard device, comprising:
   a keyboard; and
   a support for protecting the keyboard or accommodating a portable information processing device, the support comprising:
      a main body;
      a connecting portion, one end of the connecting portion being pivoted to a bottom side of the main body, and the other end of the connecting portion being connected to the keyboard;
      a first supporting portion pivoted to a first lateral side of the main body;
      a second supporting portion pivoted to a second lateral side of the main body;
      a first fastening portion pivoted to a lateral side of the first supporting portion, the first fastening portion comprising a first magnetic component;
      a second fastening portion pivoted to a lateral side of the second supporting portion, the second fastening portion comprising a first magnetic induction component, the first fastening portion and the second fastening portion being for releasably being fastened together so as to fasten the lateral side of the first supporting portion and the lateral side of the second supporting portion as the support is at a supporting state, and the first magnetic component and the first magnetic induction component being for releasably attracting each other so as to releasably fasten the first fastening portion and the second fastening portion;
      a second magnetic component disposed on the keyboard and corresponding to the first magnetic induction component; and
      a second magnetic induction component disposed on the keyboard and corresponding to the first magnetic component, the first magnetic component and the second magnetic induction component being for releasably attracting each other and the first magnetic induction component and the second magnetic component being for releasably attracting each other, as the main body, the first supporting portion, the second supporting portion, the first fastening portion and the second fastening portion are for rotating in a second direction opposite to a first direction and close to the keyboard, so as to cover a top of the keyboard;

wherein the main body is for rotating in the first direction away from the keyboard, the first supporting portion and the second supporting portion are for rotating in the first direction away from the keyboard so that the lateral side of the first supporting portion and the lateral side of the second supporting portion contact against each other, and a bottom side of the first supporting portion and a bottom side of the second supporting portion stand on a plane, so as to support the support on the plane at the supporting state as the keyboard is placed on the plane.

2. The keyboard device of claim 1, further comprising:
a first attachment portion pivoted to the bottom side of the first supporting portion; and
a second attachment portion pivoted to the bottom side of the second supporting portion;
wherein the first attachment portion and the second attachment portion are placed flatly on the plane as the support is at the supporting state, and the main body, the first supporting portion, the second supporting portion, the first fastening portion, the second fastening portion, the first attachment portion and the second attachment portion are for rotating in a second direction opposite to the first direction and close to the keyboard, so as to cover a whole top of the keyboard.

3. The keyboard device of claim 2, wherein the main body, the connecting portion, the first supporting portion, the second supporting portion, the first fastening portion, the second fastening portion, the first attachment portion and the second attachment portion are sheet structures, respectively.

4. The keyboard device of claim 3, wherein the main body substantially has a shape of a trapezoid, a rectangle, or a triangle.

5. The keyboard device of claim 1, wherein the other end of the connecting portion is connected to a bottom of the keyboard.

6. The keyboard device of claim 5, wherein a slot is formed between the main body, the connecting portion and the keyboard for accommodating the portable information processing device as the support is at the supporting state.

7. A keyboard device, comprising:
a keyboard; and
a support for protecting the keyboard or accommodating a portable information processing device, the support comprising:
a main body;
a connecting portion, one end of the connecting portion being pivoted to a bottom side of the main body, and the other end of the connecting portion being connected to the keyboard;
a first supporting portion pivoted to a first lateral side of the main body;
a second supporting portion pivoted to a second lateral side of the main body;
a first fastening portion pivoted to a lateral side of the first supporting portion, the first fastening portion comprising a third magnetic component;
a second fastening portion pivoted to a lateral side of the second supporting portion, the second fastening portion comprising a fourth magnetic component, the first fastening portion and the second fastening portion being for releasably being fastened together so as to fasten the lateral side of the first supporting portion and the lateral side of the second supporting portion as the support is at a supporting state, and the third magnetic component and the fourth magnetic component being for releasably attracting each other due to being opposite magnetic poles so as to releasably fasten the first fastening portion and the second fastening portion;
a fifth magnetic component disposed on the keyboard and corresponding to the third magnetic component, the fifth magnetic component and the third magnetic component being for releasably attracting each other due to being opposite magnetic poles; and
a sixth magnetic component disposed on the keyboard and corresponding to the fourth magnetic component, the sixth magnetic component and the fourth magnetic component being for releasably attracting each other due to being opposite magnetic poles, the fifth magnetic component and the third magnetic component being for releasably attracting each other and the sixth magnetic component and the fourth magnetic component being for releasably attracting each other, as the main body, the first supporting portion, the second supporting portion, the first fastening portion and the second fastening portion are for rotating in a second direction opposite to a first direction and close to the keyboard, so as to cover a top of the keyboard;
wherein the main body is for rotating in the first direction away from the keyboard, the first supporting portion and the second supporting portion are for rotating in the first direction away from the keyboard so that the lateral side of the first supporting portion and the lateral side of the second supporting portion contact against each other, and a bottom side of the first supporting portion and a bottom side of the second supporting portion stand on a plane, so as to support the support on the plane at the supporting state as the keyboard is placed on the plane.

8. The keyboard device of claim 7, further comprising:
a first attachment portion pivoted to the bottom side of the first supporting portion; and
a second attachment portion pivoted to the bottom side of the second supporting portion;
wherein the first attachment portion and the second attachment portion are placed flatly on the plane as the support is at the supporting state, and the main body, the first supporting portion, the second supporting portion, the first fastening portion, the second fastening portion, the first attachment portion and the second attachment portion are for rotating in a second direction opposite to the first direction and close to the keyboard, so as to cover a whole top of the keyboard.

9. The keyboard device of claim 8, wherein the main body, the connecting portion, the first supporting portion, the second supporting portion, the first fastening portion, the second fastening portion, the first attachment portion and the second attachment portion are sheet structures, respectively.

10. The keyboard device of claim 9, wherein the main body substantially has a shape of a trapezoid, a rectangle, or a triangle.

11. The keyboard device of claim 7, wherein the other end of the connecting portion is connected to a bottom of the keyboard.

12. The keyboard device of claim 11, wherein a slot is formed between the main body, the connecting portion and the keyboard for accommodating the portable information processing device as the support is at the supporting state.

13. A keyboard device, comprising:
a keyboard; and
a support for protecting the keyboard or accommodating a portable information processing device, the support comprising:
a main body;
a connecting portion, one end of the connecting portion being pivoted to a bottom side of the main body, and the other end of the connecting portion being connected to the keyboard;
a first supporting portion pivoted to a first lateral side of the main body;
a second supporting portion pivoted to a second lateral side of the main body;
a first fastening portion pivoted to a lateral side of the first supporting portion, the first fastening portion comprising a first velcro tape;
a second fastening portion pivoted to a lateral side of the second supporting portion, the second fastening portion comprising a second velcro tape, the first fastening portion and the second fastening portion being for releasably being fastened together so as to fasten the lateral side of the first supporting portion and the lateral side of the second supporting portion as the support is at a supporting state, and the the first velcro tape and the second velcro tape being for releasably attaching each other so as to releasably fasten the first fastening portion and the second fastening portion;
a third velcro tape disposed on the keyboard and corresponding to the first velcro tape; and
a fourth velcro tape disposed on the keyboard and corresponding to the second velcro tape, the third velcro tape and the first velcro tape being for releasably attaching each other and the fourth velcro tape and the second velcro tape being for releasably attaching each other, as the main body, the first supporting portion, the second supporting portion, the first fastening portion and the second fastening portion are for rotating in a second direction opposite to a first direction and close to the keyboard, so as to cover a top of the keyboard;
wherein the main body is for rotating in the first direction away from the keyboard, the first supporting portion and the second supporting portion are for rotating in the first direction away from the keyboard so that the lateral side of the first supporting portion and the lateral side of the second supporting portion contact against each other, and a bottom side of the first supporting portion and a bottom side of the second supporting portion stand on a plane, so as to support the support on the plane at the supporting state as the keyboard is placed on the plane.

14. The keyboard device of claim 13, further comprising:
a first attachment portion pivoted to the bottom side of the first supporting portion; and
a second attachment portion pivoted to the bottom side of the second supporting portion;
wherein the first attachment portion and the second attachment portion are placed flatly on the plane as the support is at the supporting state, and the main body, the first supporting portion, the second supporting portion, the first fastening portion, the second fastening portion, the first attachment portion and the second attachment portion are for rotating in a second direction opposite to the first direction and close to the keyboard, so as to cover a whole top of the keyboard.

15. The keyboard device of claim 14, wherein the main body, the connecting portion, the first supporting portion, the second supporting portion, the first fastening portion, the second fastening portion, the first attachment portion and the second attachment portion are sheet structures, respectively.

16. The keyboard device of claim 15, wherein the main body substantially has a shape of a trapezoid, a rectangle, or a triangle.

17. The keyboard device of claim 13, wherein the other end of the connecting portion is connected to a bottom of the keyboard.

18. The keyboard device of claim 17, wherein a slot is formed between the main body, the connecting portion and the keyboard for accommodating the portable information processing device as the support is at the supporting state.

19. A keyboard device, comprising:
a keyboard;
a support for protecting the keyboard or accommodating a portable information processing device, the support comprising:
a main body;
a connecting portion, one end of the connecting portion being pivoted to a bottom side of the main body, and the other end of the connecting portion being connected to the keyboard;
a first supporting portion pivoted to a first lateral side of the main body;
a second supporting portion pivoted to a second lateral side of the main body;
a first fastening portion pivoted to a lateral side of the first supporting portion; and
a second fastening portion pivoted to a lateral side of the second supporting portion, the first fastening portion and the second fastening portion being for releasably being fastened together so as to fasten the lateral side of the first supporting portion and the lateral side of the second supporting portion as the support is at a supporting state; and
a first attachment portion pivoted to a bottom side of the first supporting portion; and
a second attachment portion pivoted to a bottom side of the second supporting portion, the first attachment portion and the second attachment portion being placed flatly on a plane as the support is at the supporting state, and the main body, the first supporting portion, the second supporting portion, the first fastening portion, the second fastening portion, the first attachment portion and the second attachment portion being for rotating in a second direction opposite to a first direction and close to the keyboard, so as to cover a whole top of the keyboard;
wherein the main body is for rotating in the first direction away from the keyboard, the first supporting portion and the second supporting portion are for rotating in the first direction away from the keyboard so that the lateral side of the first supporting portion and the lateral side of the second supporting portion contact against each other, and a bottom side of the first supporting portion and a bottom side of the second supporting portion stand on the plane, so as to support the support on the plane at the supporting state as the keyboard is placed on the plane.

20. The keyboard device of claim 19, wherein the main body, the connecting portion, the first supporting portion, the second supporting portion, the first fastening portion, the second fastening portion, the first attachment portion and the second attachment portion are sheet structures, respectively.

21. The keyboard device of claim 20, wherein the main body substantially has a shape of a trapezoid, a rectangle, or a triangle.

22. The keyboard device of claim 21, wherein the other end of the connecting portion is connected to a bottom of the keyboard.

23. The keyboard device of claim 22, wherein a slot is formed between the main body, the connecting portion and the keyboard for accommodating the portable information processing device as the support is at the supporting state.

24. A keyboard device, comprising:
- a keyboard;
- a support for protecting the keyboard or accommodating a portable information processing device, the support comprising:
  - a main body;
  - a connecting portion, one end of the connecting portion being pivoted to a bottom side of the main body, and the other end of the connecting portion being connected to the keyboard, the other end of the connecting portion being connected to a bottom of the keyboard;
  - a first supporting portion pivoted to a first lateral side of the main body; and
  - a second supporting portion pivoted to a second lateral side of the main body;
- wherein the main body is for rotating in a first direction away from the keyboard, the first supporting portion and the second supporting portion are for rotating in the first direction away from the keyboard so that the lateral side of the first supporting portion and the lateral side of the second supporting portion contact against each other, a bottom side of the first supporting portion and a bottom side of the second supporting portion stand on a plane, so as to support the support on the plane at a supporting state as the keyboard is placed on the plane, and a slot is formed between the main body, the connecting portion and the keyboard for accommodating the portable information processing device as the support is at the supporting state.

* * * * *

UNITED STATES PATENT AND TRADEMARK OFFICE
CERTIFICATE OF CORRECTION

| | | |
|---|---|---|
| PATENT NO. | : 8,995,149 B2 | Page 1 of 1 |
| APPLICATION NO. | : 13/792188 | |
| DATED | : March 31, 2015 | |
| INVENTOR(S) | : Chih-Hao Chen | |

It is certified that error appears in the above-identified patent and that said Letters Patent is hereby corrected as shown below:

On the title page, item (73), correct the residence of the first assignee from "SUZHOU, JIANGSU PROVINCE (JP)" to --SUZHOU, JIANGSU PROVINCE (CN)--.

Signed and Sealed this
First Day of September, 2015

Michelle K. Lee
*Director of the United States Patent and Trademark Office*